(12) United States Patent
Cheah et al.

(10) Patent No.: US 11,798,894 B2
(45) Date of Patent: Oct. 24, 2023

(54) DEVICES AND METHODS FOR SIGNAL INTEGRITY PROTECTION TECHNIQUE

(71) Applicant: Intel Corporation, Santa Clara, CA (US)

(72) Inventors: Bok Eng Cheah, Bukit Gambir (MY); Jackson Chung Peng Kong, Tanjung Tokong (MY); Khang Choong Yong, Puchong (MY); Kooi Chi Ooi, Glugor (MY); Min Suet Lim, Simpang Ampat (MY)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 16/451,557

(22) Filed: Jun. 25, 2019

(65) Prior Publication Data
US 2020/0126928 A1 Apr. 23, 2020

(30) Foreign Application Priority Data

Oct. 22, 2018 (MY) .............. PI2018703902

(51) Int. Cl.
H01L 21/48 (2006.01)
H01L 23/498 (2006.01)
(Continued)

(52) U.S. Cl.
CPC .......... *H01L 23/552* (2013.01); *H01L 21/481* (2013.01); *H01L 21/4846* (2013.01); *H01L 23/49838* (2013.01); *H01L 24/08* (2013.01); *H01L 24/16* (2013.01); *H01L 24/73* (2013.01); *H01L 2224/16237* (2013.01);
(Continued)

(58) Field of Classification Search
None
See application file for complete search history.

(56) References Cited

U.S. PATENT DOCUMENTS 6,434,016 B2 * 8/2002 Zeng ................. H05K 1/181
361/760
7,402,901 B2 * 7/2008 Hatano ............. H01L 23/5389
257/684
(Continued)

FOREIGN PATENT DOCUMENTS

WO WO-2018125209 A1 * 7/2018 ............. H01L 23/00

Primary Examiner — Telly D Green
(74) Attorney, Agent, or Firm — Compass IP Law PC

(57) ABSTRACT

The technique described herein includes a device to address the electrical performance (e.g. signal integrity) degradation ascribed to electromagnetic interference and/or crosstalk coupling occur at tightly coupled (e.g. about 110 μm pitch or less) interconnects, including the first level (e.g. the interconnection between a die and a package substrate). In some embodiments, this invention provides a conductive layer with a plurality of cavities to isolate electromagnetic coupling and/or interference between adjacent interconnects for electronic device performance scaling. In some embodiments, at least one interconnect joint is coupled to the conductive layer, and at least one interconnect joint is isolated from the conductive layer by a dielectric lining at least one of the cavities, the conductive layer being associated to a ground reference voltage by the interconnect joint coupled to the conductive layer.

8 Claims, 10 Drawing Sheets

(51) Int. Cl.
*H01L 23/00* (2006.01)
*H01L 23/552* (2006.01)

(52) U.S. Cl.
CPC ............... *H01L 2224/73204* (2013.01); *H01L 2224/81203* (2013.01); *H01L 2924/3025* (2013.01)

(56) References Cited

U.S. PATENT DOCUMENTS

| | | | | |
|---|---|---|---|---|
| 8,913,401 B2* | 12/2014 | Iguchi | ............... | H05K 1/0243 361/803 |
| 9,147,663 B2* | 9/2015 | Liu | ............... | H01L 23/5384 |
| 9,337,120 B2* | 5/2016 | Li | ............... | H01L 23/36 |
| 9,520,349 B2* | 12/2016 | Hsu | ............... | H01L 24/08 |
| 9,646,894 B2* | 5/2017 | Chen | ............... | H01L 22/14 |
| 10,643,945 B2* | 5/2020 | Collins | ............... | H01L 25/18 |
| 10,978,399 B2* | 4/2021 | Darmawikarta | ............... | H01L 24/17 |
| 2002/0063319 A1* | 5/2002 | Huang | ............... | H01L 23/13 257/678 |
| 2008/0093726 A1* | 4/2008 | Preda | ............... | H01L 23/5383 257/700 |
| 2008/0315409 A1* | 12/2008 | Cordes | ............... | H01L 25/0655 257/737 |
| 2009/0244874 A1* | 10/2009 | Mahajan | ............... | H05K 1/142 361/809 |
| 2012/0063095 A1* | 3/2012 | Sinha | ............... | H01L 24/32 361/714 |
| 2012/0106117 A1* | 5/2012 | Sundaram | ............... | H01L 25/18 361/808 |
| 2013/0168854 A1* | 7/2013 | Karikalan | ............... | H01L 24/73 257/738 |
| 2014/0048928 A1* | 2/2014 | Li | ............... | H01L 23/49811 257/737 |
| 2014/0117552 A1* | 5/2014 | Qian | ............... | H01L 23/53228 257/762 |
| 2014/0133115 A1* | 5/2014 | Iguchi | ............... | H05K 1/0243 361/760 |
| 2014/0332966 A1* | 11/2014 | Xiu | ............... | C09J 163/00 257/773 |
| 2014/0353827 A1* | 12/2014 | Liu | ............... | H01L 23/5383 257/751 |
| 2015/0001717 A1* | 1/2015 | Karhade | ............... | H01L 24/17 257/741 |
| 2015/0001733 A1* | 1/2015 | Karhade | ............... | H01L 23/49894 257/774 |
| 2015/0061101 A1* | 3/2015 | Le | ............... | H01L 23/3135 257/676 |
| 2016/0049378 A1* | 2/2016 | Song | ............... | H01L 23/34 257/712 |
| 2016/0056125 A1* | 2/2016 | Pan | ............... | H01L 25/50 257/676 |
| 2016/0088736 A1* | 3/2016 | Sankman | ............... | H05K 3/0017 361/748 |
| 2016/0379959 A1* | 12/2016 | We | ............... | H01L 25/105 257/773 |
| 2018/0005945 A1* | 1/2018 | Pietambaram | ............... | H01L 23/5385 |
| 2018/0006002 A1* | 1/2018 | Tsai | ............... | H01L 24/75 |
| 2018/0182699 A1* | 6/2018 | Lai | ............... | H01L 23/5383 |
| 2018/0286812 A1* | 10/2018 | Jain | ............... | H01L 24/16 |
| 2018/0331042 A1* | 11/2018 | Manusharow | ............... | H01L 23/49822 |
| 2018/0366438 A1* | 12/2018 | Kim | ............... | H01L 23/585 |
| 2019/0041923 A1* | 2/2019 | Atsatt | ............... | H03K 19/0008 |
| 2019/0042127 A1* | 2/2019 | Weber | ............... | G06F 12/0875 |
| 2019/0206792 A1* | 7/2019 | Collins | ............... | H01L 25/0655 |
| 2019/0287944 A1* | 9/2019 | Ziglioli | ............... | H01L 24/32 |
| 2019/0304911 A1* | 10/2019 | Collins | ............... | H01L 23/147 |
| 2019/0304915 A1* | 10/2019 | Jain | ............... | H01L 23/147 |
| 2020/0006236 A1* | 1/2020 | Collins | ............... | H01L 21/486 |
| 2020/0035606 A1* | 1/2020 | Bhagavat | ............... | H01L 25/0655 |
| 2020/0051915 A1* | 2/2020 | Darmawikarta | ............... | H01L 23/53228 |
| 2020/0235051 A1* | 7/2020 | Collins | ............... | H01L 23/49838 |
| 2020/0243448 A1* | 7/2020 | Qian | ............... | H01L 24/19 |
| 2020/0266149 A1* | 8/2020 | Xu | ............... | H01L 25/0655 |
| 2021/0111088 A1* | 4/2021 | Jain | ............... | H01L 23/5386 |

\* cited by examiner

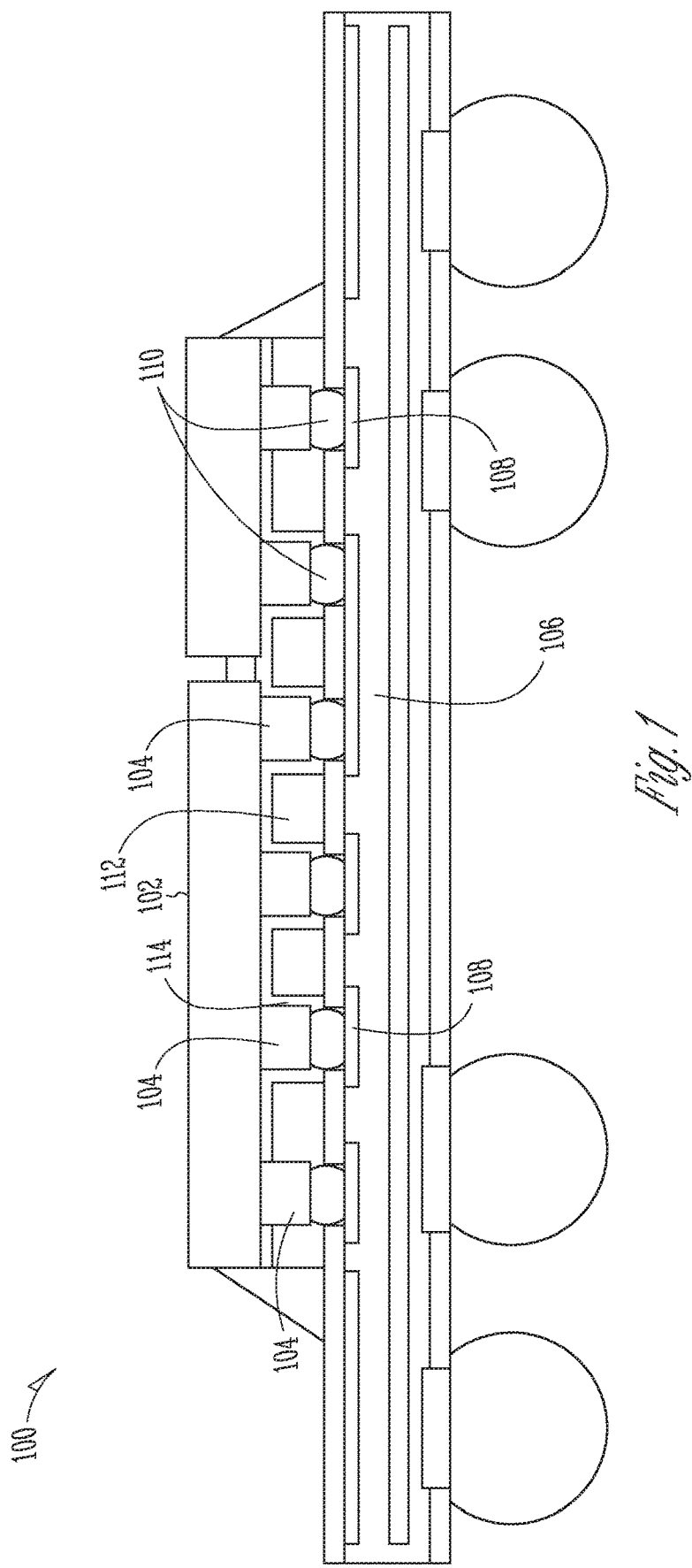

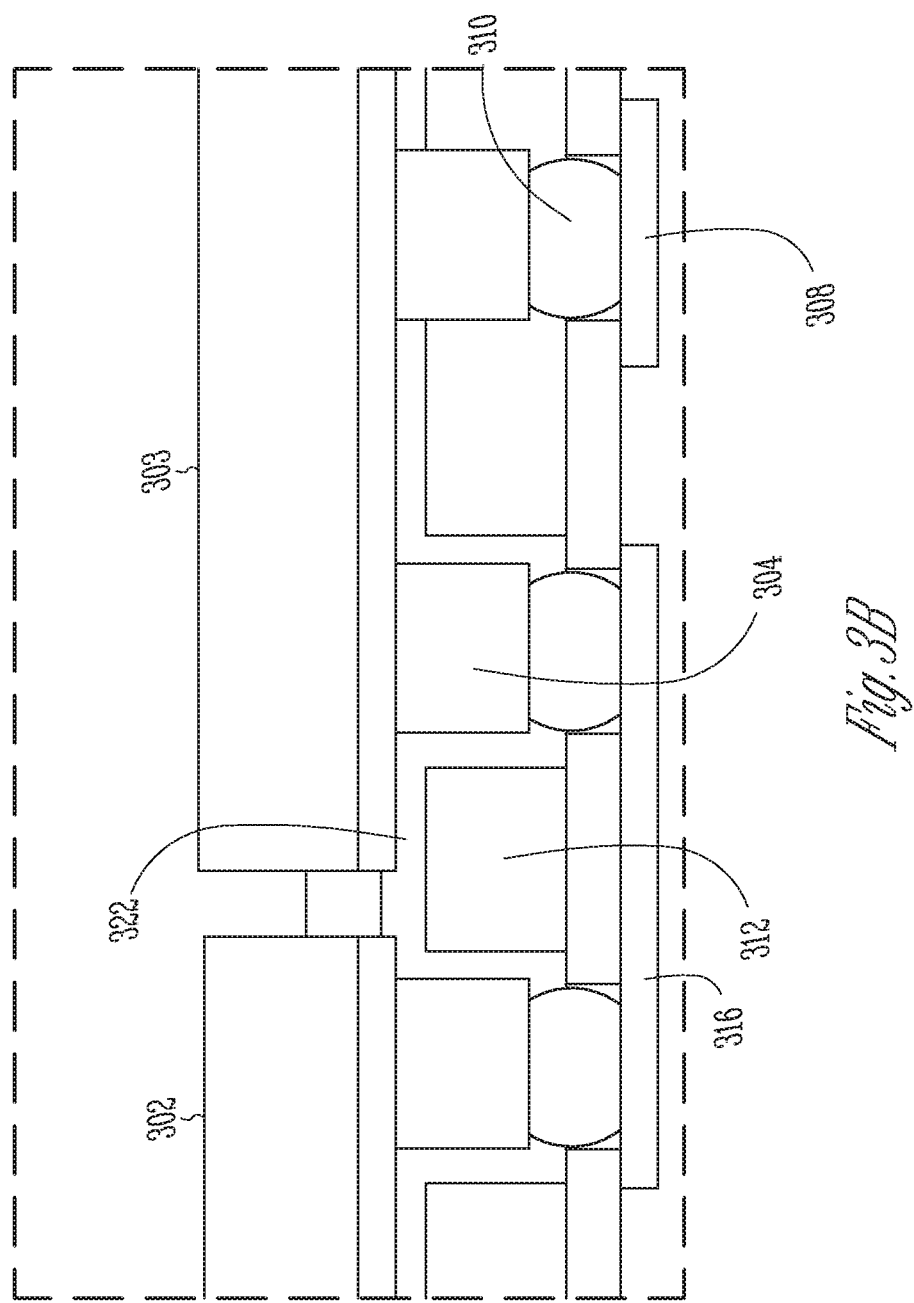

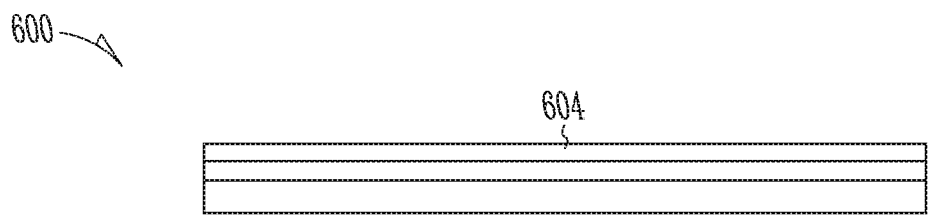
*Fig.6.1*
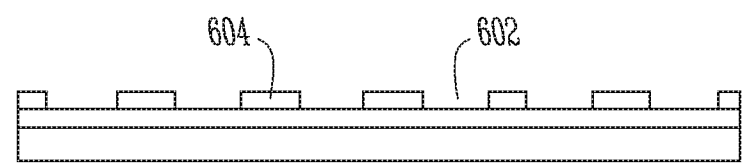
*Fig.6.2*
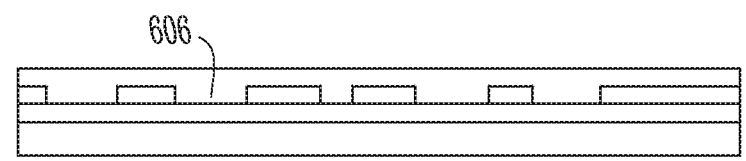
*Fig.6.3*
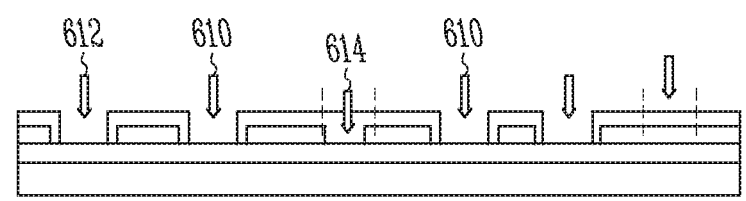
*Fig.6.4*

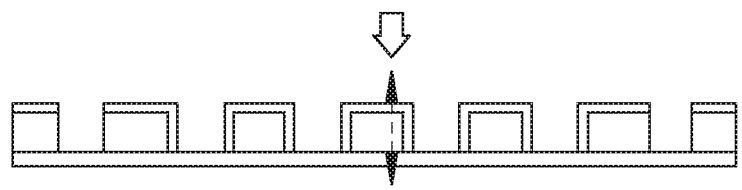
Fig.6.5
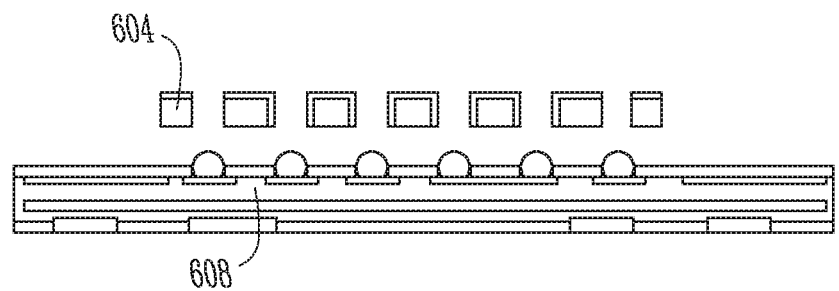
Fig.6.6
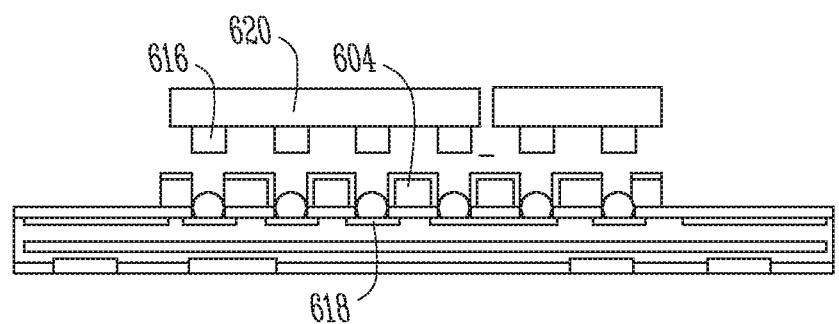
Fig.6.7
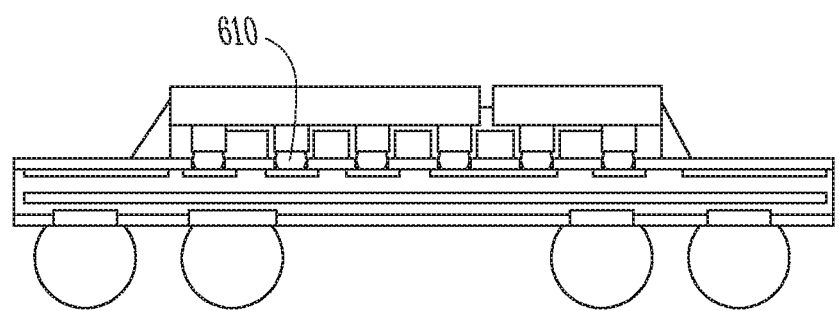
Fig.6.8

DEVICES AND METHODS FOR SIGNAL INTEGRITY PROTECTION TECHNIQUE

PRIORITY APPLICATION

This application claims the benefit of priority to Malaysian Application Serial Number PI 2018703902, filed Oct. 22, 2018, which is incorporated herein by reference in its entirety.

TECHNICAL FIELD

Embodiments described herein pertain generally to microelectronic devices and systems, and more particularly, to integrated circuit design, packaging, and manufacturing. Some embodiments relate to first level interconnects.

BACKGROUND

In semiconductor device fabrication, assembly often involves the direct connection of a die to a package substrate using conductive bumps that are added to the die. The bumps are then soldered to a package substrate, forming mechanical and electrical connections. The first level interconnect is the connection between the die and the package substrate. Technology scaling has resulted in very tightly-coupled first level interconnects. As the space between interconnects and other integrated circuit packaging structures continues to shrink, unintended electrical interactions (e.g. crosstalk) is increasingly causing undesired interference. As a result, signal integrity degradation due to crosstalk is becoming a limiting factor for input/output data-rate and silicon area performance scaling in semiconductor device design and fabrication. Integrated circuits with signal integrity problems can suffer from slow operation, unreliability, or a total failure to operate. Thus, it is desirable to provide a technique that can help address these concerns and others.

BRIEF DESCRIPTION OF THE DRAWINGS

FIG. 1 shows a diagram of a multi-chip package design with a conductive layer according to an embodiment of the invention.

FIGS. 3A & 3B show a diagram of a multi-chip package design with a conductive layer according to an embodiment of the invention.

FIGS. 6.1-6.8 show a flow diagram of a fabrication process for a multi-chip package design with a conductive layer according to various embodiments of the invention described herein.

DETAILED DESCRIPTION

Figure 2A:
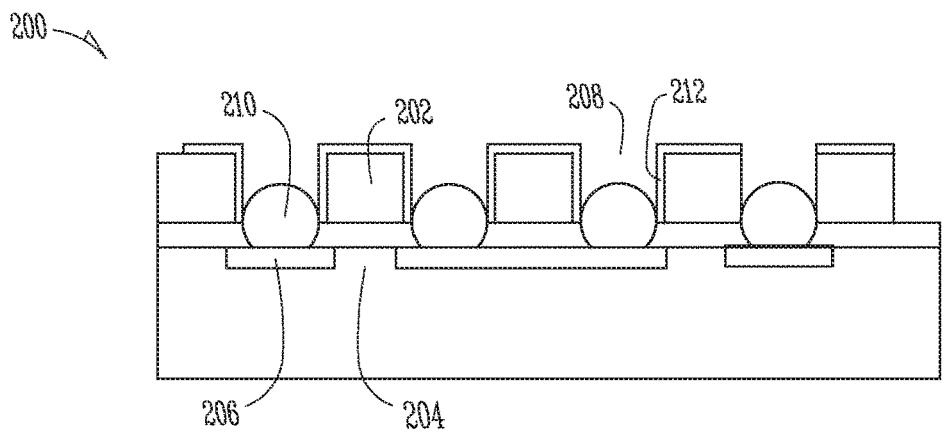
FIG. 2A shows a diagram of the conductive layer on a package substrate according to an embodiment of the invention.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The technique described herein includes a device to address the electrical performance (e.g. signal integrity) degradation ascribed to electromagnetic interference and/or crosstalk coupling occurring at interconnects, particularly when tightly coupled (e.g. about 110 μm pitch or less), and at the first level (e.g. the interconnection between a die and a package substrate). This invention provides a conductive layer to aid in isolating electromagnetic coupling and/or interference between adjacent interconnects for electronic device performance scaling.

Signal degradation is a factor that may cause devices to operate poorly or completely fail to operate. Signal degradation due to crosstalk has increasingly become a limiting factor for input/output (I/O) data-rate and silicon area scaling. This is especially so for single-ended bus e.g. die-to-die interconnects (2 Gbps-32 Gbps) and/or memory (2000 MT/s-8500 MT/s) interfaces. Therefore, mitigating signal degradation remains an important consideration during the design and testing of devices.

Referring to FIG. 1, a device 100 is shown according to some embodiments described herein. The device 100 can include, or be included in, an electronic device or system, such as a computer (e.g., desktop, laptop, or notebook), a tablet, a cellular phone, or other electronic devices or systems. The device 100 includes at least one die 102. The at least one die 102 may be an integrated circuit chip, such as a processor, a memory device, a system on chip, or others. The die 102 may be a part of single or multi-chip packages. The die 102 may contain, or be made from, silicon or other semiconductor materials, including, but not limited to germanium, tin, gallium arsenide, gallium nitride or combinations thereof. Other die materials are within the scope of the invention.

Die 102 may include one, or a plurality of, die contacts 104. Die contacts 104 may appear in a variety of physical forms, for example, the die contacts 104 may be shaped as bumps, protrusions, flat surfaces, or in other forms on the die 102. The die contacts 104 may be made from copper, aluminum, tin, tungsten, zinc, gold, and nickel, and any combination thereof, as well as other metals or other conductive materials. The die 102 is coupled to the package substrate 106 through a plurality of interconnect joints 110 between the die contacts 104 and the substrate contacts 108. The package substrate 106 includes at least one, or a plurality of, substrate contacts 108. Substrate contacts 108, like die contacts 104, may appear in a variety of physical forms, for example, in the shape of, but not limited to, bumps, protrusions, flat surfaces mounted flush within the package substrate 106, or flat surfaces mounted on top of the package substrate 106. The substrate contacts 108, like die contacts 104, may be made from copper, aluminum, tin, tungsten, zinc, gold, and nickel, and any combination thereof, as well as other metals or other conductive materials. At least some of the interconnect joints 110 between the die contacts 104 and the substrate contacts 108 pass through the conductive layer 112. In an embodiment, at least some of the interconnect joints 110 are isolated from the conductive layer 112 by a dielectric layer 114.

FIG. 2A shows a diagram of a device 200 according to some embodiments described herein. A conductive layer 202 is disposed on a package substrate 204 according to an example of the invention. The package substrate has at least one, or a plurality of, substrate contacts 206. Substrate contacts 206 may appear in a variety of physical forms, for example, substrate contacts 206 may appear in the shape of, but not limited to, bumps, protrusions, flat surfaces flush mounted within the package substrate, or flat surfaces mounted on top of the package substrate. Substrate contacts 206 may be made from copper, aluminum, tin, tungsten, zinc, gold, and nickel, or any combination thereof, as well as other metals or other conductive materials.

The conductive layer 202 includes a plurality of cavities 208 that extend through the conductive layer 202. At least some of the interconnect joints 210 pass through the cavities 208 in the conductive layer 202. The interconnect joints 210 can be comprised of conductive epoxy, or various solder materials, such as, but not limited to, a variety of tin, lead and/or zinc alloys. Other materials are within the scope of the invention. In an embodiment, at least some of the interconnect joints 210 are isolated from the conductive layer 202 by a dielectric layer 212.

Figure 2B:
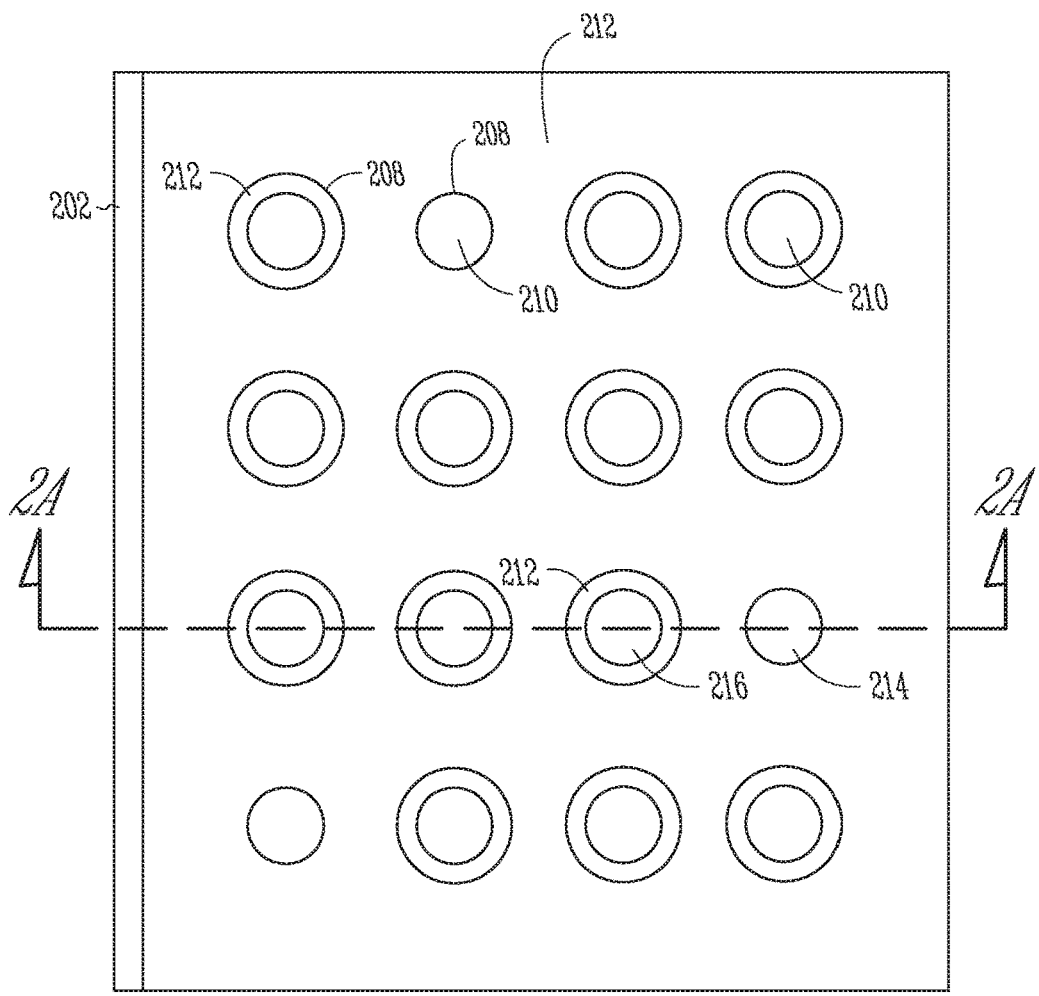
FIG. 2B shows a top-view diagram of a conductive layer according to embodiments of the invention.

FIG. 2B is a top-view diagram of an embodiment of the conductive layer 202. Some of the interconnect joints 210 that pass through the conductive layer 202 function as ground-coupled interconnect joints 214. Ground-coupled interconnect joints 214 are associated to a ground reference (Vss) potential through electrical connection to a ground source in a die, motherboard, intermediate circuit-board and/or a platform system. There may be one or more ground reference potentials, for example, the ground potential of one ground source location may not be the same as another ground source location. The conductive layer 202 is thereby associated to a ground reference potential through one or more ground-coupled interconnect joints 214. The cavities 208 in which ground-coupled interconnect joints pass through do not contain dielectric 212, to prevent isolation of conductive layer 202 from a ground source.

In an embodiment, some of the interconnect joints 210 that pass through the conductive layer 202 are isolated from the conductive layer by dielectric 212. Dielectric 212 may line the walls of some of the cavities 208, and/or cover one or more surfaces of conductive layer 202. Dielectric 212 may be a curable polymer resin, polyimide adhesive, or other organic based materials that are less conductive than a conductor.

Some of the interconnect joints 210 that pass through conductive layer 202 function as signal-coupled interconnect joints 216. Signal-coupled interconnect joints 216 are electrically isolated from conductive layer 202 by dielectric 212. Dielectric 212 lines the cavities in which signal-coupled interconnect joints 216 pass through. The signal-coupled interconnect joints may carry various signals, including carrying a power supply.

Conductive layer 202 described herein can have a range of physical dimensions. In different embodiments, conductive layer 202 ranges in thickness. In some examples, the conductive layer has a thickness ranging from 10 µm to 80 µm, in some examples, from 10 µm-70 µm, and in some examples, from 20 µm-50 µm. Additionally, the diameter of cavities 208 range in size, and not all cavities 208 need be identical in dimension. Cavities 208 may be of one or more different diameters in a single embodiment of the invention. The diameter of cavities 208 can be configured to have diameters ranging from about 10% to 30% of the diameter of interconnect joints 210. For example, an interconnect with diameter of 50 µm has a cavity diameter ranging between 55 µm and 65 µm.

Conductive layer 202 described herein may be constructed from a variety of conductive materials. For example, copper, aluminum, tin, tungsten, zinc, gold, and nickel, and any combination thereof may be used, as well as other metals or other conductive materials. Additionally, in some embodiments, conductive layer 202 may be included in a laminate comprised of multiple layers. In some examples, one or more of the layers may be a dielectric material, such as curable polymer resin, polyimide adhesive, organic based materials, or others less conductive than a conductor. In some examples, one or more of the layers may be made from glass, ceramic, or a polymer. One or more of the layers may also be an adhesive used to bond layers together. In embodiments where a laminate containing one or more layers of non-conductive material is used, the outer surface or surfaces of the conductive layer 212 are covered and/or coated with a conductive material.

Figure 3A:
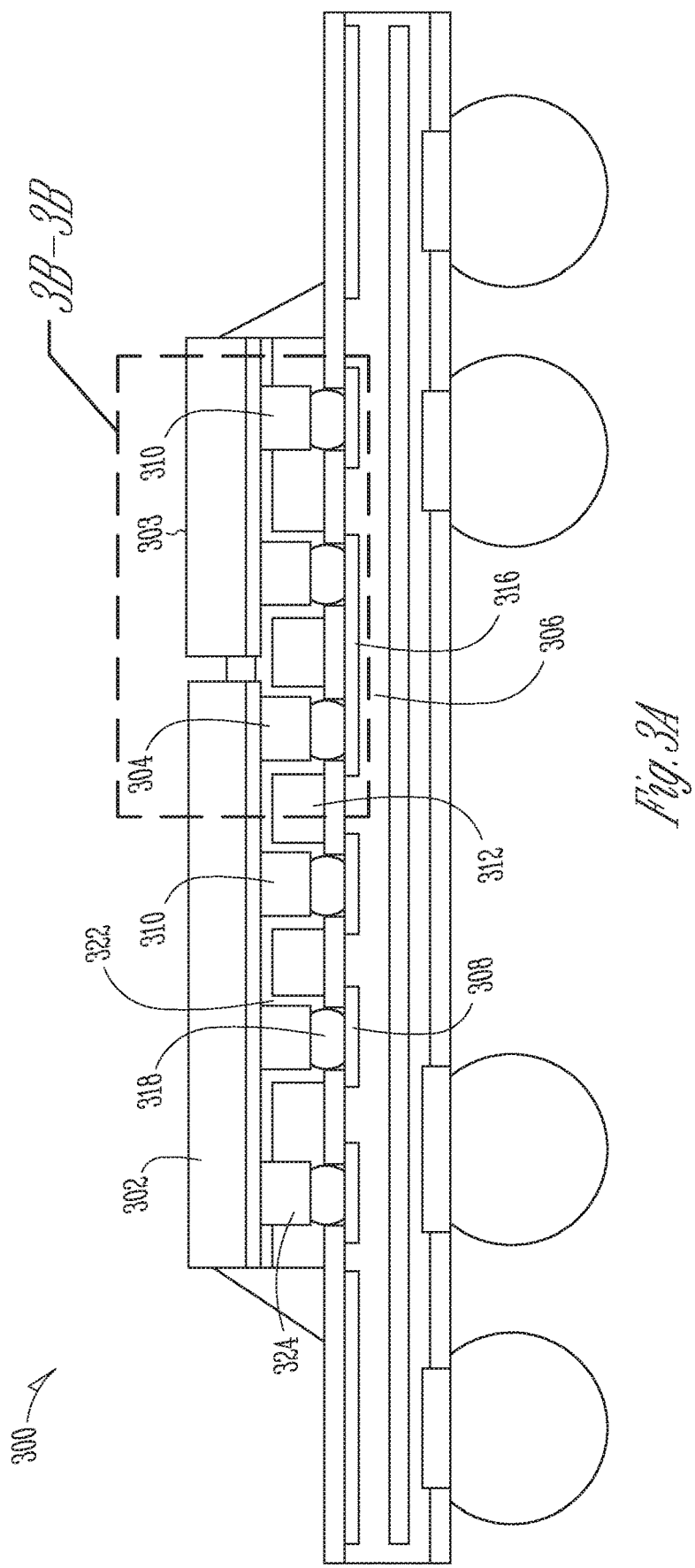

FIGS. 3A & 3B show an embodiment of a multi-chip package design with a conductive layer according to an embodiment of the invention described herein. Device 300 is a multiple-chip package (MCP) with a conductive layer for mitigating crosstalk between interconnect joints 310. Device 300 includes at least a first die 302 and a second die 303. The first die 302 and the second die 303 are electrically connected by a conductive die-to-die interconnect 316. Die-to-die interconnect 316 may be made from copper, aluminum, tin, tungsten, zinc, gold, and nickel, or any combination thereof, as well as other metals or other conductive materials. Die-to-die interconnect 316 may also be a bridge die, comprised of conductive and semi-conductive materials. Device 300 further includes a plurality of die contacts 304, a package substrate 306, which includes a plurality of substrate contacts 308. The package substrate 306 is coupled to at least first die 302 or second die 303 through a plurality of interconnect joints 310. At least some of the plurality of interconnect joints 310 pass through the conductive layer 312.

The device 300 includes at least one die 302. Die 302 may, for example, be a logic central processing unit (CPU), a platform controller hub (PCH) chipset, a memory, a programmable field gate array (FPGA), a graphic processing unit (GPU) or a sensor. Die 302 is coupled to the package substrate 306 through at least one, or a plurality of, interconnect joints 310. In an embodiment of the invention, the first die 302 could be a CPU, the second die 303 could be a PCH chipset or GPU, and the first and second dies are coupled together through interconnect joints 310 and/or die-to-die interconnect 316.

In an embodiment, the conductive layer 312 is associated to a ground reference voltage (Vss) potential through contact with at least one of the ground-coupled interconnect joints 324. Ground-coupled interconnect joints are comprised of an interconnect joint 310 that is coupled to a ground (Vss) source in a die 302 or 303, and/or in the platform system. There may be one or more ground reference potentials, for example, the ground potential of one ground source location may not be the same as another ground source location. Additionally, at least one of the interconnect joints 310 that passes through conductive layer 312 are signal-coupled interconnect joints 318. Signal-coupled interconnect joints 318 are electrically isolated from conductive layer 312 by dielectric 322 and may carry a variety of different signals or a power supply.

Figure 4A:
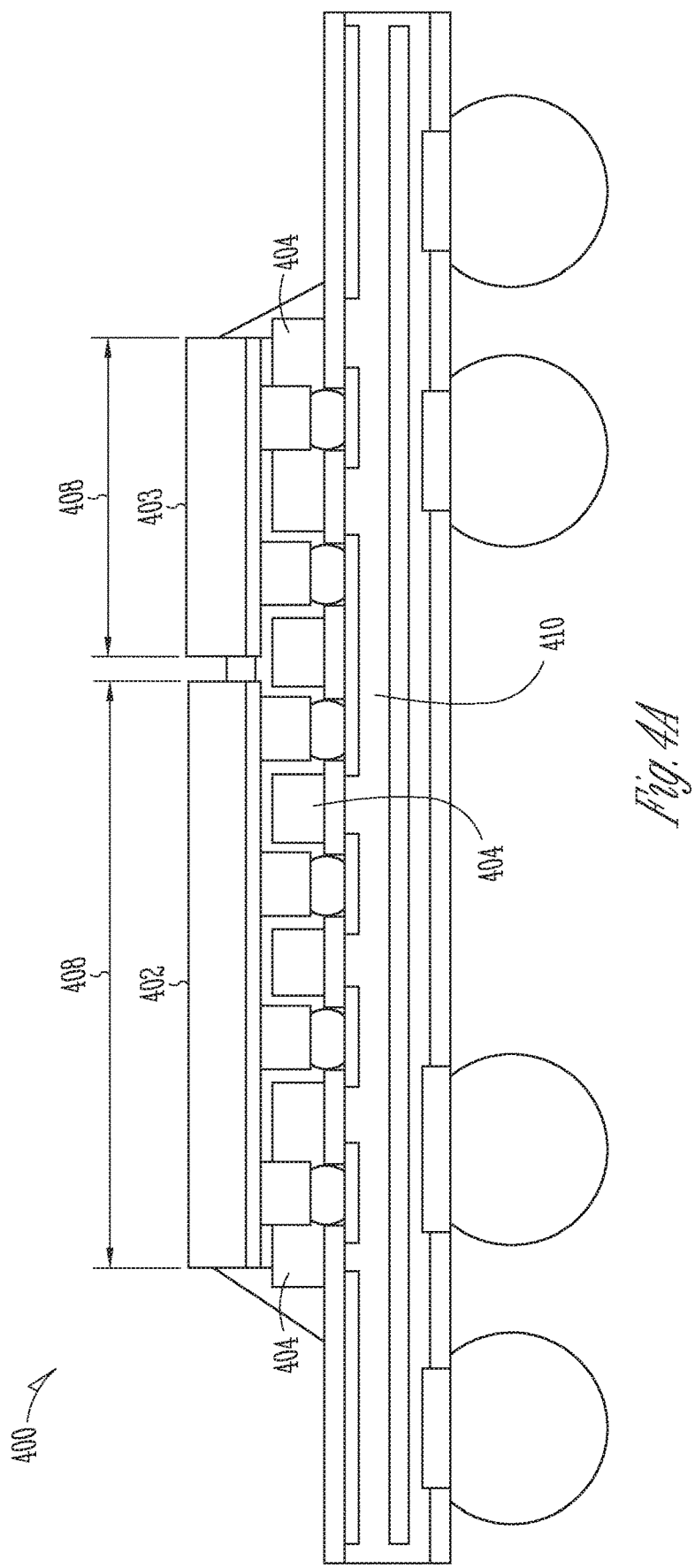
FIGS. 4A & 4B show diagrams of additional examples of multi-chip package designs with a conductive layer according to additional embodiments of the invention.

FIG. 4A illustrates an additional embodiment of an example of chip package design with an example of a conductive layer. Device 400 may have single or multiple dies. Device 400 has a conductive layer 404 that extends beyond the footprint 408 of the first die 402 and/or the second die 403. The footprint 408 represents the area directly under a die, such as die 402 or die 403. Expanding the size of conductive layer 404 beyond the footprint 408 of one or more dies provides the benefits of improved resistance to warpage and mechanical protection through increasing the torsional stiffness and rigidity of package substrate 410. In some embodiments, the conductive layer 404 extends beyond one or more linear dimensions of the footprint 408 of the dies, such as 402 and 403, by an area about 10-50%, 10-40%, or 20-30% larger than the total footprint area of the dies. The conductive layer 404 may also act as an additional reference layer and/or electromagnetic shield for signals routed away from the die footprint 408 regions.

Figure 4B:
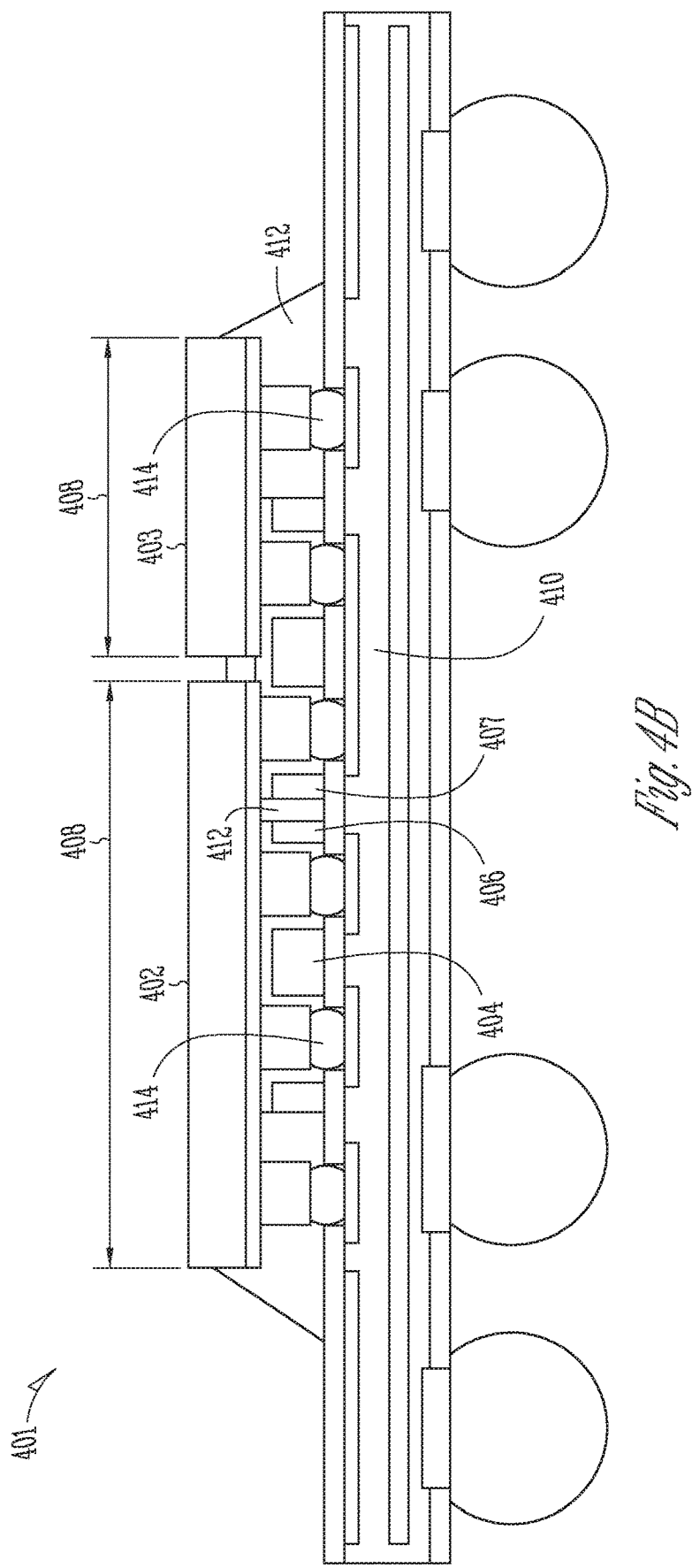

FIG. 4B illustrates an embodiment of a device 401, a chip package wherein the conductive layer 404 is comprised of at least a first 406 and second 407 co-planar pieces. In some embodiments, the first 406 and second 407 co-planar pieces are separated by underfill 412, the underfill flowing by capillary action or otherwise filling the gaps between the first 406 and second 407 co-planar pieces. The gap or space between the die 402 and substrate 410 may also be filled by underfill 412. The conductive segments 406 and 407 may move within the area under the first 402 and/or second die 403, and additionally, outside of die footprint 408, to allow the inflow of underfill material 412 for enhanced mechanical and electrical protection for the interconnect joints 414. Underfill 412 may be a composite of inorganic fillers and/or organic polymers, such as formulations of epoxy, silica, urethane, alumina, or any other material suitable to be used in integrated circuit packaging technologies involving direct electrical connections.

Figure 5:
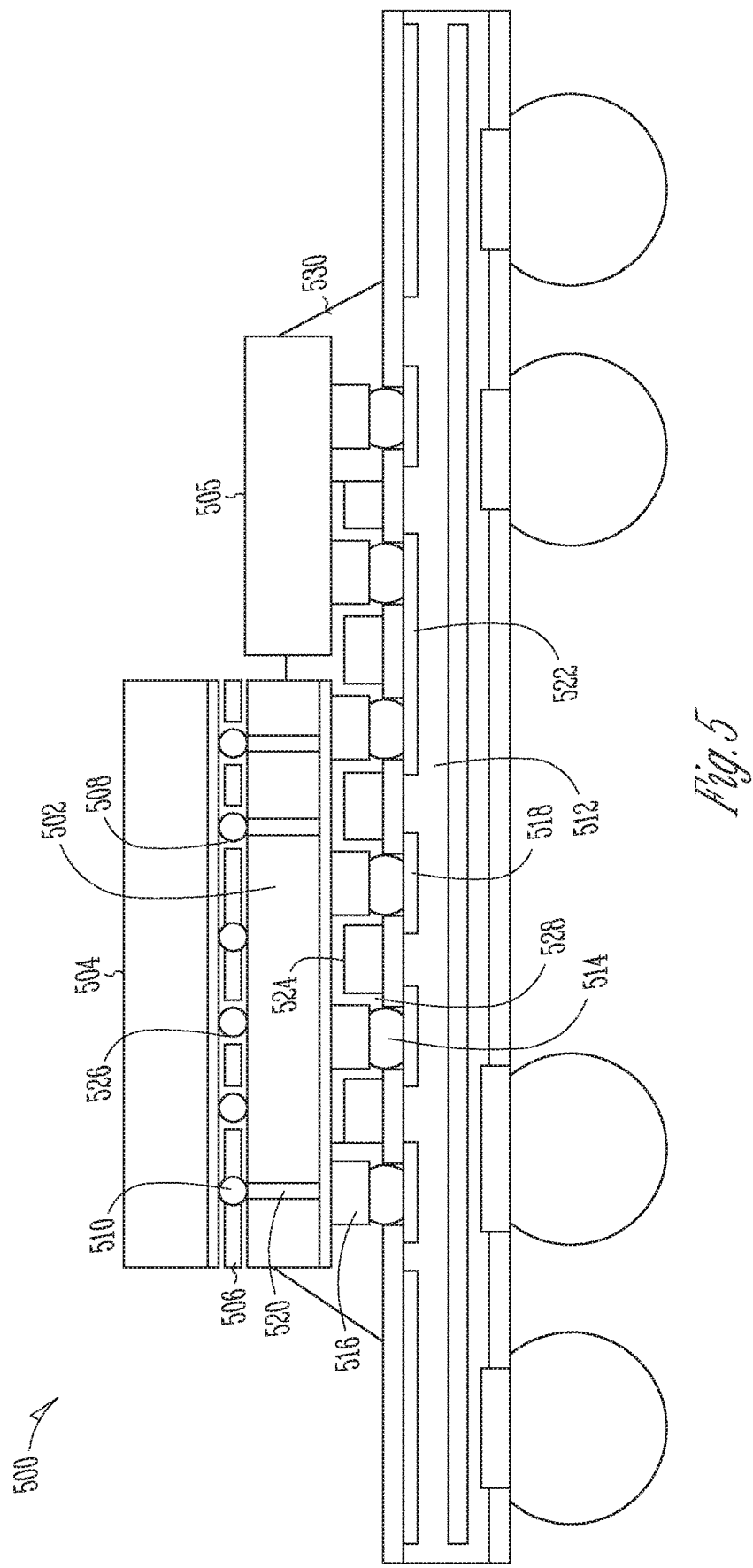
FIG. 5 shows a diagram of a stacked multi-chip package design with a conductive layer according to an additional embodiment of the invention.

FIG. 5 is a diagram of a multi-chip package in a stacked chip orientation according to an embodiment of the invention. The multi-chip package design 500 includes a least a first die 502 and a second die 504, with a subsequent conductive layer 506 disposed between first die 502 and second die 504. The subsequent conductive layer 506 has a plurality of cavities 508 through which a plurality of primary interconnect joints 510 pass through. The first die 502 is coupled to a package substrate 512 through a plurality of secondary interconnect joints 514 between the die contacts 516 and the substrate contacts 518. The interconnect joints 510 and 514 can be comprised of conductive epoxy, or various solder materials, such as, but not limited to, a variety of tin, lead and/or zinc alloys. The second die 504 is connected to the package substrate 512 through one or more through-silicon via (TSV) channels 520 that pass through first die 502.

In some embodiments, the multi-chip package 500 includes at least a third die 505 arranged planar with first die 502 and is connected to first die 504 through a die-to-die interconnect 522. Die-to-die interconnect 522 may also be a bridge die, comprised of conductive and semi-conductive materials. In some embodiments, a second conductive layer 524 may be used between the first die 502 and/or third die 505 and the package substrate 512. Second conductive layer 524 may have a plurality of cavities 528 through which secondary interconnect joins 514 may pass through. In some embodiments, underfill 530 may be introduced in the area under the dies, for example, dies 502, 504, and/or 505 to fill gaps between them and package substrate 512. Underfill 530, similar to underfill 412, may be a composite of inorganic fillers and/or organic polymers, such as formulations of epoxy, silica, urethane, alumina, or any other material suitable to be used in integrated circuit packaging technologies involving direct electrical connections.

In an embodiment, one or more of the primary interconnect joints 510, and thereby, the TSV channels 520 they are connected to, are isolated from the conductive layer 506 by dielectric 526. Dielectric 526 is similar to dielectric 212. In some embodiments, the conductive layer 506 is associated to a ground reference voltage (Vss) potential through contact with at least one primary interconnect joint 510 that is not insulated from the conductive layer 506 by dielectric 526. Additionally, at least one of the primary interconnect joints 510 and TSVs 520 that pass through conductive layer 506 and first die 502 are insulated from conductive layer 506 by dielectric 526 may carry various signals or a power supply. In an embodiment, the pitch (i.e. center to center distance) between two adjacent primary interconnect joints 510 ranges in between 10 μm to 50 μm.

FIGS. 6.1-6.8 show an embodiment of an assembly process to manufacture a multi-chip package with a conductive layer according to an example of the invention. The order of assembly process 600 is interchangeable. Process 600 includes at least the steps of forming cavities 602 in a conductive layer 604, forming a dielectric 606 in at least one of the cavities 602 in the conductive layer 604, and attaching at least one die 620 to a package substrate 608 using interconnect joints 610 that pass through the cavities 602 in the conductive layer 604. The conductive layer 604 may be manufacturing using wafer level or batch processing.

The conductive layer 604 may be constructed from a variety of conductive materials. For example, copper, aluminum, tin, tungsten, zinc, gold, and nickel, and any combination thereof may be used, as well as other metals or other conductive materials. Additionally, in some embodiments, conductive layer 604 may be included in a laminate comprised of multiple layers. In some embodiments, one or more of the layers may be a dielectric material, such as curable polymer resin or polyimide adhesive. In some examples, one or more of the layers may be made from glass, ceramic, or polymers. One or more of the layers may also be an adhesive used to bond layers together. In embodiments where a laminate containing one or more layers of non-conductive material is used, the outer surface or surfaces of the conductive layer 604 are covered and/or coated with a conductive material. Additionally, the conductive layer 604 described herein can range in physical dimension. The conductive layer 604, in different embodiments, ranges in thickness. In some examples, the conductive layer has a thickness ranging from 10 μm to 80 μm, in some examples, from 10 μm-70 μm, and in some examples, from 20 μm-50 μm.

Referring to FIG. 6.2, forming the cavities 602 in the conductive layer 604 may be accomplished using various processes including, but not limited to, laser drilling or etching. The diameter of cavities 602 can range in physical size. The diameter of cavities 602 can be configured to have diameters ranging from about 10% to 30% of the diameter of interconnect joints 610. For example, an interconnect with diameter of 50 μm has a cavity diameter ranging between 55 μm and 65 μm. Additionally, not all cavities 610 may be identical in dimension. As seen in FIG. 6.4, cavities 610 may be of one or more different diameters in a single embodiment of the invention, as first cavities 612 have a greater diameter than second cavities 614.

Referring to FIG. 6.3, dielectric 606, similar to dielectric 212, may be a variety of polymers, such as curable polymer resin, polyimide adhesive, or other organic based materials that are less conductive than a conductor. In some embodiments, the dielectric 606 may be formed in one or more cavities 602, or over the entire surface of conductive layer 604 using a variety of processes including, but not limited to, hot-press lamination or sputtering. In embodiments where the dielectric is to be removed for direct interconnect joint 610 contact with conductive layer 604, the dielectric may be removed from the desired cavities with various processes including, but not limited to, laser drilling or etching as illustrated in FIG. 6.4.

Referring to FIGS. 6.5 & 6.6, in some embodiments, conductive layer 604 may be mechanically cut or diced into two or more segments. The conductive layer or layer segments can be attached to package substrate 608 using various process including, but not limited to, hot press lamination or thermal compression bonding.

Referring to FIG. 6.7, interconnect joints 610 are formed through the connection of die contacts 616 and substrate contacts 618 using conductive epoxy, or various solder materials, such as, but not limited to, a variety of tin, lead and/or zinc alloys, attaching the at least one die 620 to the package substrate 608. The die contacts 616 and substrate contacts 618 may appear in a variety of physical forms, for example, in the shape of bumps, protrusions, flat surfaces, or in other forms. They may be made from copper, aluminum, tin, tungsten, zinc, gold, and nickel, and any combination thereof, as well as other metals or other conductive materials. In addition to the interconnect joints 610, the at least one die 620 may be attached to the package substrate using various processes including, but not limited to, reflow soldering or thermal compression bonding. The dies may be aligned and placed on the package substrate 608 using surface-mount technology (SMT).

Figure 7:
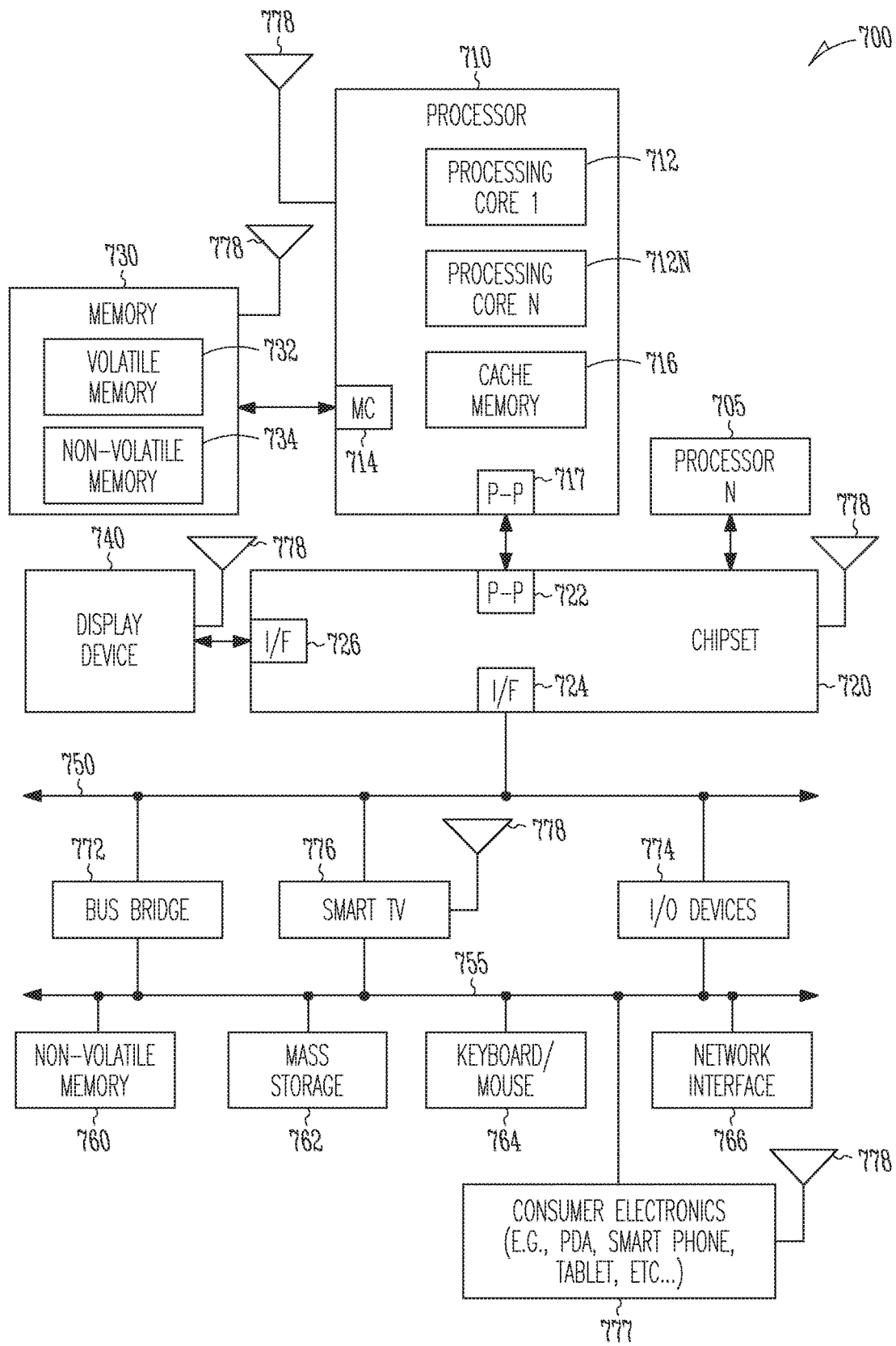
FIG. 7 shows a system level diagram of an electronic device that may include an example of a conductive layer according to an embodiment of the invention.

FIG. 7 illustrates a system level diagram, depicting an example of an electronic device (e.g., system) that may include a conductive layer and/or methods described above. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 includes a system on a chip (SOC) system.

In one embodiment, processor 710 has one or more processor cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, an interface for wireless antenna 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the example system, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices, including a bus bridge 772, a smart TV 776, I/O devices 774, nonvolatile memory 760, a storage medium (such as one or more mass storage devices) 762, a keyboard/mouse 764, a network interface 766, and various forms of consumer electronics 777 (such as a PDA, smart phone, tablet etc.), etc. In one embodiment, chipset 720 couples with these devices through an interface 724. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a light emitting diode (LED) array, an organic light emitting diode (OLED) array, or any other form of visual display device. In some embodiments of the example system, processor 710 and chipset 720 are merged into a single SOC. In addition, chipset 720 connects to one or more buses 750 and 755 that interconnect various system elements, such as I/O devices 774, nonvolatile memory 760, storage medium 762, a keyboard/mouse 764, and network interface 766. Buses 750 and 755 may be interconnected together via a bus bridge 772.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 16 is depicted as a separate block within processor 710, cache memory 716 (or selected aspects of 716) can be incorporated into processor core 712.

The techniques described herein can help achieve numerous improvements including, but not limited to: (1) improved electrical performance (i.e. signal integrity) through improved vertical crosstalk shielding at C4 interconnects; additional voltage reference or shielding for signal traces routed on package surface layer especially at bump break-out (die shadow) regions; (2) silicon footprint reduction through continuous silicon bump pitch scaling i.e. <100 µm; (3) device performance (data bandwidth) improvement with higher I/O density through bump pitch reduction and/or relaxation of signal-to-ground ratio requirement; and (4) improved package warpage control through a rigid metal shield layer, as an alternative solution to package stiffener solution that requires package real-estate trade-off and restriction of die-side component placement.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

What is claimed is:

1. A device comprising:
   a first and a second die located side by side to one another, each die having a plurality of die contacts,
   a multiple layer package substrate with a plurality of substrate contacts, wherein the multiple layer package substrate is coupled to the first and second die through a plurality of interconnect joints between the die contacts and the substrate contacts;
   at least one die-to-die interconnect between two substrate contacts; and
   a conductive layer with a plurality of cavities, the conductive layer located below the first and second dies and above the multiple layer package substrate, wherein the plurality of interconnect joints pass through the cavities in the conductive layer, wherein at least one interconnect joint passes through, and is coupled to the conductive layer, and at least one interconnect joint is isolated from the conductive layer by a dielectric lining at least one of the cavities, the conductive layer being associated to a ground reference voltage by the interconnect joint coupled to the conductive layer.

2. The device of claim 1, wherein the conductive layer is part of a laminate comprised of multiple layers.

3. The device of claim 2, wherein one of the layers of the laminate is an organic-based compound.

4. The device of claim 1, wherein the conductive layer has a thickness between about 10 µm and 80 µm.

5. The device of claim 1, wherein the conductive layer is comprised of at least a first and second co-planar pieces, wherein the pieces are separated by underfill, filling gaps between a die and the multiple layer package substrate.

6. The device of claim 1, wherein the conductive layer extends beyond the footprint of dies to provide additional mechanical stiffness and electromagnetic shielding.

7. The device of claim 6, wherein the conductive layer extends beyond one or more linear dimensions of the footprint of the dies by an area about 10-50% larger than the total footprint area of the dies.

8. The device of claim 1, further comprising a third die stacked on top of the first or second die; and a subsequent conductive layer between the third die and the first or second die, wherein a plurality of conductive through silicon vias (TSVs) pass through the first or second die and the cavities in the conductive layer, connecting the second die to the substrate.

* * * * *